US012684694B2

(12) United States Patent
Huang et al.

(10) Patent No.: US 12,684,694 B2
(45) Date of Patent: Jul. 14, 2026

(54) PACKAGE STRUCTURE

(71) Applicant: Industrial Technology Research Institute, Hsinchu (TW)

(72) Inventors: Yu-Wei Huang, Chiayi City (TW); Ching-Feng Yu, Miaoli County (TW); Chih-Cheng Hsiao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 152 days.

(21) Appl. No.: 18/149,660

(22) Filed: Jan. 3, 2023

(65) Prior Publication Data

US 2024/0080984 A1     Mar. 7, 2024

(30) Foreign Application Priority Data

Sep. 5, 2022    (TW) .................................. 111133561

(51) Int. Cl.
    H05K 1/181        (2026.01)
    H10W 90/00        (2026.01)
(52) U.S. Cl.
    CPC .......... H05K 1/181 (2013.01); H10W 90/401 (2026.01); *H05K 2201/10378* (2013.01); *H05K 2201/10515* (2013.01); *H05K 2201/10522* (2013.01); *H05K 2201/1053* (2013.01)
(58) Field of Classification Search
    CPC ........ H05K 1/142; H05K 1/144; H05K 1/145; H05K 1/181; H05K 2201/10378; H05K 2201/10515; H05K 2201/10522
    See application file for complete search history.

(56) References Cited

U.S. PATENT DOCUMENTS

| | | | |
|---|---|---|---|
| 7,791,898 B2 * | 9/2010 | Peytavy | H05K 1/0275 |
| | | | 361/795 |
| 9,263,373 B2 | 2/2016 | Hu | |
| 9,543,249 B1 | 1/2017 | Hu | |
| 9,648,754 B1 * | 5/2017 | Iyer | H05K 3/301 |
| 9,673,148 B2 | 6/2017 | Hu | |
| 9,812,379 B1 * | 11/2017 | Chiu | H01L 21/4853 |
| 10,283,434 B2 * | 5/2019 | Sakai | H01L 23/5385 |
| 10,998,272 B2 | 5/2021 | Aleksov et al. | |
| 11,469,206 B2 * | 10/2022 | Elsherbini | H01L 24/83 |

(Continued)

FOREIGN PATENT DOCUMENTS

| | | |
|---|---|---|
| CN | 107301978 | 10/2017 |
| CN | 111244082 | 6/2020 |
| TW | 201801266 | 1/2018 |

OTHER PUBLICATIONS

"Office Action of Taiwan Counterpart Application", issued on Jan. 9, 2024, p. 1-p. 7.

*Primary Examiner* — Paresh Paghadal
(74) *Attorney, Agent, or Firm* — JCIPRNET

(57)        ABSTRACT

A package structure, including a circuit board, multiple circuit structure layers, at least one bridge structure, and at least one supporting structure, is provided. The circuit structure layer is disposed on the circuit board. The bridge structure is connected between the two adjacent circuit structure layers. The supporting structure is located between the two adjacent circuit structure layers, and the supporting structure has a first end and a second end opposite to each other and respectively connecting the bridge structure and the circuit board.

16 Claims, 13 Drawing Sheets

(56) References Cited

U.S. PATENT DOCUMENTS

| | | | |
|---|---|---|---|
| 12,113,048 B2 * | 10/2024 | Elsherbini | H01L 25/50 |
| 2004/0134400 A1 * | 7/2004 | Thiemke | A01C 7/20 |
| | | | 111/178 |
| 2009/0057800 A1 * | 3/2009 | Suzuki | H05K 1/141 |
| | | | 257/434 |
| 2009/0152742 A1 * | 6/2009 | Ikeguchi | H01L 23/5385 |
| | | | 257/E23.141 |
| 2009/0279243 A1 * | 11/2009 | Amidi | H05K 1/144 |
| | | | 361/679.31 |
| 2013/0014982 A1 * | 1/2013 | Segawa | H05K 1/142 |
| | | | 29/830 |
| 2013/0075903 A1 * | 3/2013 | Pagaila | H01L 25/16 |
| | | | 257/737 |
| 2016/0095218 A1 * | 3/2016 | Sakurai | H05K 3/426 |
| | | | 361/768 |
| 2017/0084576 A1 * | 3/2017 | Yu | H01L 24/05 |
| 2017/0110407 A1 * | 4/2017 | Chaware | H01L 23/5385 |
| 2017/0110628 A1 * | 4/2017 | Shatalov | H10H 20/841 |
| 2019/0254156 A1 * | 8/2019 | Xie | H05K 1/115 |
| 2020/0144186 A1 | 5/2020 | Thomas et al. | |
| 2020/0294920 A1 | 9/2020 | Hariri et al. | |
| 2021/0134724 A1 | 5/2021 | Rubin et al. | |
| 2022/0167504 A1 * | 5/2022 | Hasegawa | H01L 27/14618 |
| 2022/0201860 A1 * | 6/2022 | Kim | H05K 1/181 |

* cited by examiner

PACKAGE STRUCTURE

CROSS-REFERENCE TO RELATED APPLICATION

This application claims the priority benefit of Taiwan application serial no. 111133561, filed on Sep. 5, 2022. The entirety of the above-mentioned patent application is hereby incorporated by reference herein and made a part of this specification.

TECHNICAL FIELD

The disclosure relates to a package structure, and relates to a package structure for a large-area high-efficiency carrier.

BACKGROUND

Since the integrated circuit (IC) carrier benefits from high-speed computing, high power, and increased electronic integration density, the developmental trend of expanding the area of the high-end carrier to large-area applications is driven. However, under the load of the process temperature, the thermal deformation of each structure may be different due to difference in the thermal expansion coefficient of each material, causing warpage deformation of the structure. The deformation may cause difficulty in thinning, delamination of the structure, circuit breakage of the circuit structure layer, solder ball damage, etc., thereby limiting the scope of applicability of subsequent wafers.

SUMMARY

The package structure of the disclosure includes a circuit board, multiple circuit structure layers, at least one bridge structure, and at least one supporting structure. The circuit structure layer is disposed on the circuit board. The bridge structure is connected between the two adjacent circuit structure layers. The supporting structure is located between the two adjacent circuit structure layers, and the supporting structure has a first end and a second end opposite to each other and respectively connecting the bridge structure and the circuit board.

In an embodiment of the disclosure, each of the at least one bridge structure includes a buffer layer.

In an embodiment of the disclosure, each of the at least one bridge structure further includes a metal circuit layer. The metal circuit layer is disposed on the buffer layer, and the metal circuit layer is electrically connected between the two adjacent circuit structure layers.

In an embodiment of the disclosure, the package structure further includes multiple first solder joints. The first solder joints are disposed between each circuit structure layer and the circuit board. Each circuit structure layer is electrically connected to the circuit board through the first solder joints.

In an embodiment of the disclosure, the package structure further includes multiple second solder joints. The second solder joints are disposed between each bridge structure and the circuit structure layers. Each bridge structure is electrically connected to the circuit structure layers through the second solder joints.

In an embodiment of the disclosure, the package structure further includes at least one elastic layer. The elastic layer is disposed between the second end of the supporting structure and the circuit board.

In an embodiment of the disclosure, the package structure further includes at least one first colloid and multiple second colloids. The first colloid is disposed between the second end of the supporting structure and the circuit board, and the second colloids are disposed between each bridge structure and the circuit structure layers.

In order for the features and advantages of the disclosure to be more comprehensible, the following specific embodiments are described in detail in conjunction with the drawings.

DETAILED DESCRIPTION OF DISCLOSED EMBODIMENTS

The following embodiments are described in detail with the drawings, but the provided embodiments are not intended to limit the scope of the disclosure. In addition, the drawings are for illustrative purposes and are not drawn to the original size, and different layers or regions may be enlarged or reduced to be shown in a single drawing. Furthermore, although "first", "second", etc. are used herein to describe different elements, regions, and/or components, the elements, regions, and/or components should not be limited by the terms. Rather, the terms are used to distinguish one element, region, or component from another element, region, or component. Therefore, a first element, region, or component discussed below may be referred to as a second element, region, or component without departing from the teachings of the embodiments.

Herein, spatially relative terms such as "upper" and "lower" are defined with reference to the drawings. Therefore, it should be understood that the term "upper surface" may be used interchangeably with the term "lower surface", and when an element such as a layer or a film is described as being disposed on another element, the element may be directly placed on the other element or there may be an intervening element between the two elements. On the other hand, when an element is described as being directly disposed on another element, there is no intervening element between the two elements.

FIG. 1A to FIG. 1I are schematic cross-sectional views of some manufacturing process steps of a package structure according to an embodiment of the disclosure. A manufacturing method of a package structure according to an embodiment of the disclosure will be described below with reference to FIG. 1A to FIG. 1I. FIG. 1A to FIG. 1I schematically illustrate the splicing of two circuit structure layers, but the actual number of splicing is not limited thereto.

Figures 1A, 1B:
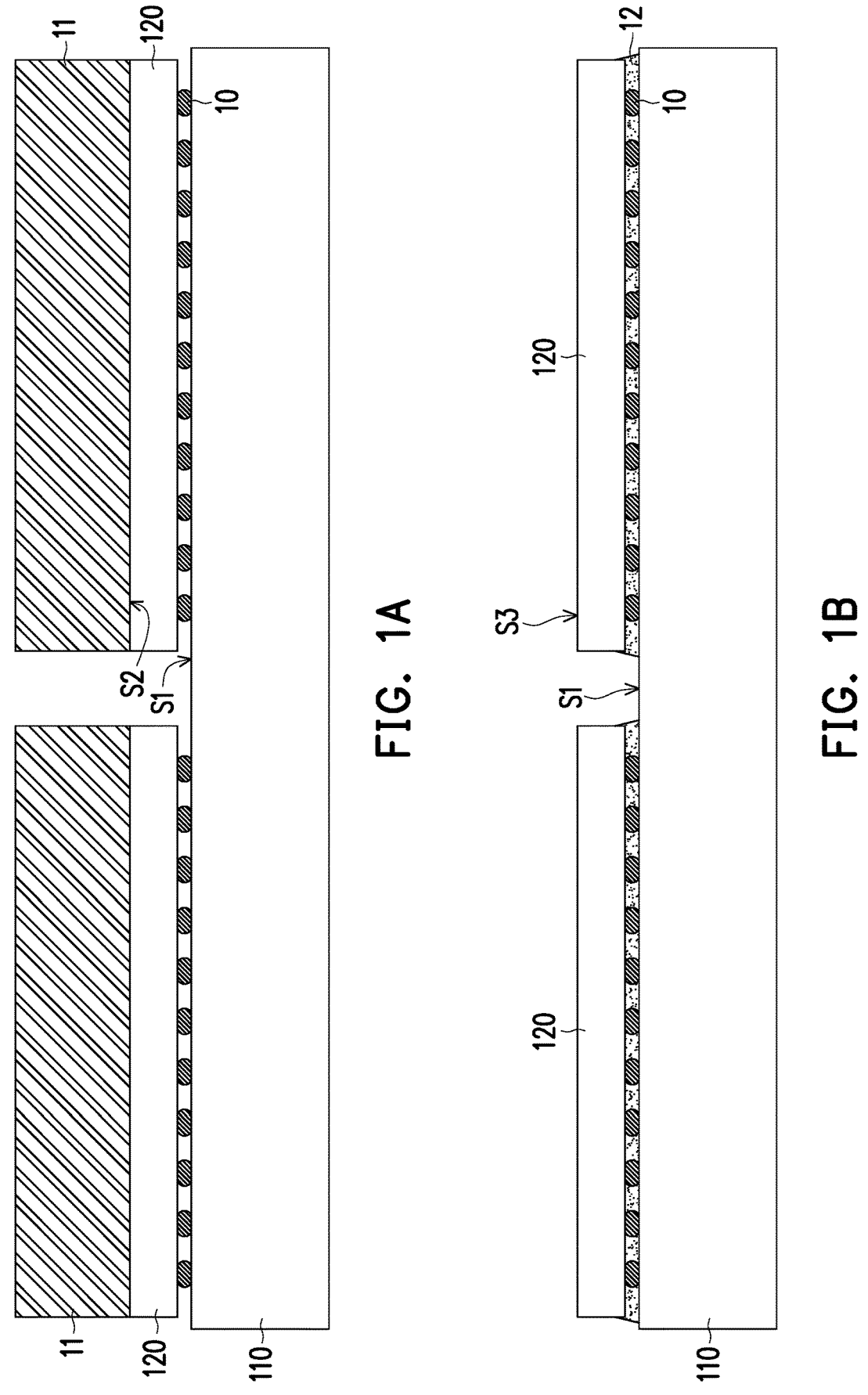
FIG. 1A to FIG. 1I are schematic cross-sectional views of some manufacturing process steps of a package structure according to an embodiment of the disclosure.

First, as shown in FIG. 1A, a circuit board (printed circuit board, PCB) 110 having multiple contacts 10 on a surface S1 is provided. Here, the contact 10 is, for example, a solder ball, but not limited thereto. Multiple circuit structure layers 120 are arranged on the surface S1 of the circuit board 110 in arrays and may be electrically connected to a circuit structure in the circuit board 110 through the contacts 10.

In the embodiment, the circuit structure layer 120 includes a redistribution layer formed of wires and dielectric materials, and the materials may include Ajinomoto build-up film (ABF), polyimide (PI), polybenzoxazole (PBO), copper (Cu), aluminum (Al), etc., but the disclosure is not limited thereto. Here, the circuit structure layer 120 is a fine line layer. In the embodiment, the manufacturing process may be to first additionally manufacture the circuit structure layer 120. For example, the circuit structure layer 120 is first formed on a plane S2 of a substrate (carrier) 11. Next, the circuit structure layer 120 and the substrate 11 are flipped, so that the side of the circuit structure layer 120 that is not combined with the substrate 11 faces the circuit board 110 and is combined with the surface S1 of the circuit board 110, but the disclosure is not limited thereto.

In the embodiment, the line width and the line spacing of the circuit structure layer 120 are smaller than the line width and the line spacing of the circuit board 110. The substrate 11 is, for example, a glass carrier, made of silicone, etc., but the disclosure is not limited thereto.

Next, as shown in FIG. 1B, the substrate 11 is removed. An underfill 12 is provided. The underfill 12 is formed between the circuit structure layer 120 and the circuit board 110, and the underfill 12 surrounds the contact 10 to protect the contact 10. The underfill 12 is, for example, polymer or epoxy resin, but the disclosure is not limited thereto. In other embodiments, the configuration of the underfill 12 may also be omitted, but the disclosure is not limited thereto.

Figure 1C:
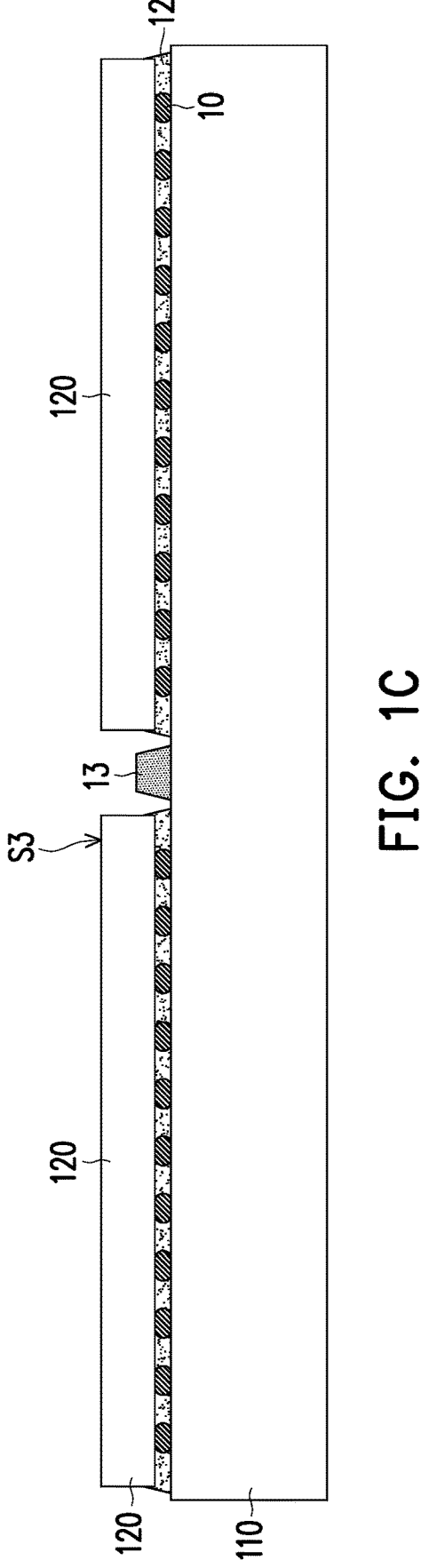

Next, as shown in FIG. 1C, dispensing is performed to form a colloid 13 on the circuit board 110. The colloid 13 is located between the two adjacent circuit structure layers 120, and the colloid 13 may be a conductive material or a non-conductive material, but the disclosure is not limited thereto. In the embodiment, the colloid 13 is separated from the circuit structure layer 120, but the disclosure is not limited thereto.

Figure 1D:
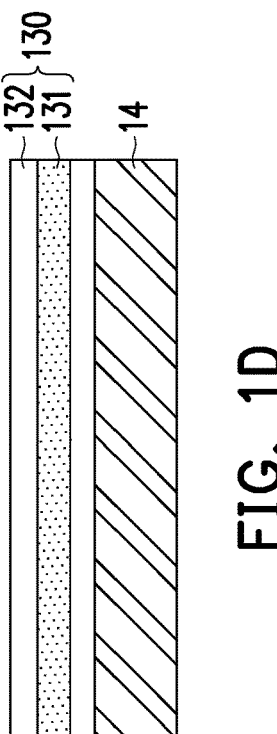

Next, as shown in FIG. 1D, at least one bridge structure 130 is provided. The bridge structure 130 includes a buffer layer 131 and a metal circuit layer 132. The bridge structure 130 may be first disposed on the substrate 14. The material of the substrate 14 includes glass, silicone, or others, but the disclosure is not limited thereto. The metal circuit layer 132 includes a track or a wire and is disposed on the buffer layer 131. The buffer layer 131 is located between the substrate 14 and the metal circuit layer 132, and the buffer layer 131 may be used to fill in assembly tolerance and provide a buffer force during the manufacturing process, so as to improve the manufacturing yield. In the embodiment, the buffer layer 131 may be made of an elastic material with a Young's modulus ranging from 1 GPa to 100 GPa, and the material of the buffer layer 131 may include rubber, but the disclosure is not limited thereto.

Figures 1E, 1F:
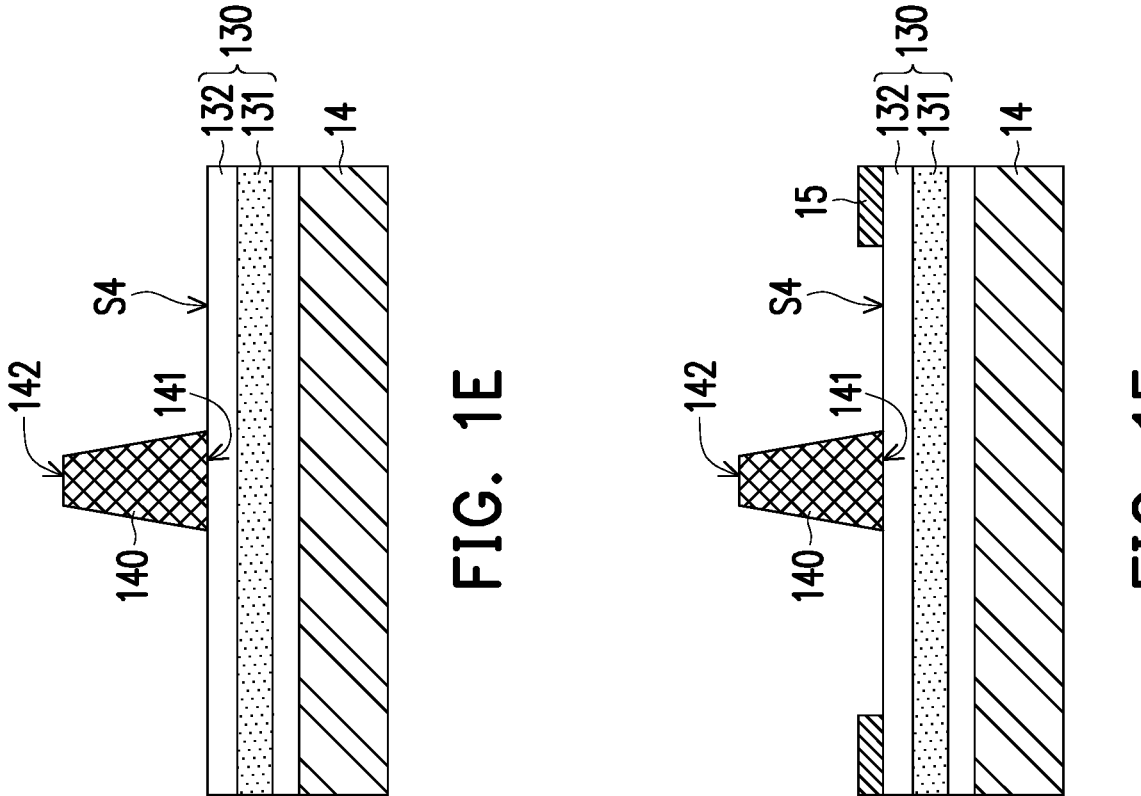

Next, as shown in FIG. 1E, at least one supporting structure 140 is provided. A first end 141 of the supporting structure 140 is connected to a surface S4 of the bridge structure 130. Here, the surface S4 of the bridge structure 130 is, for example, an upper surface connected to the metal circuit layer 132. In the embodiment, the supporting structure 140 is formed by lithography, but the disclosure is not limited thereto.

In an embodiment, the material of the supporting structure 140 may include silicon (Si), organic, or others, but the disclosure is not limited thereto. In an embodiment, the Young's modulus of the supporting structure 140 is between 1 GPa and 150 GPa, but the disclosure is not limited thereto. In an embodiment, the thermal expansion coefficient of the supporting structure 140 is between 1 ppm and 50 ppm, but the disclosure is not limited thereto.

Next, as shown in FIG. 1F, two contacts 15 are formed on the surface S4 of the metal circuit layer 132, and the supporting structure 140 is located between the two contacts 15. The contact 15 is, for example, solder dispensing, but the disclosure is not limited thereto.

Figures 1G, 1H:
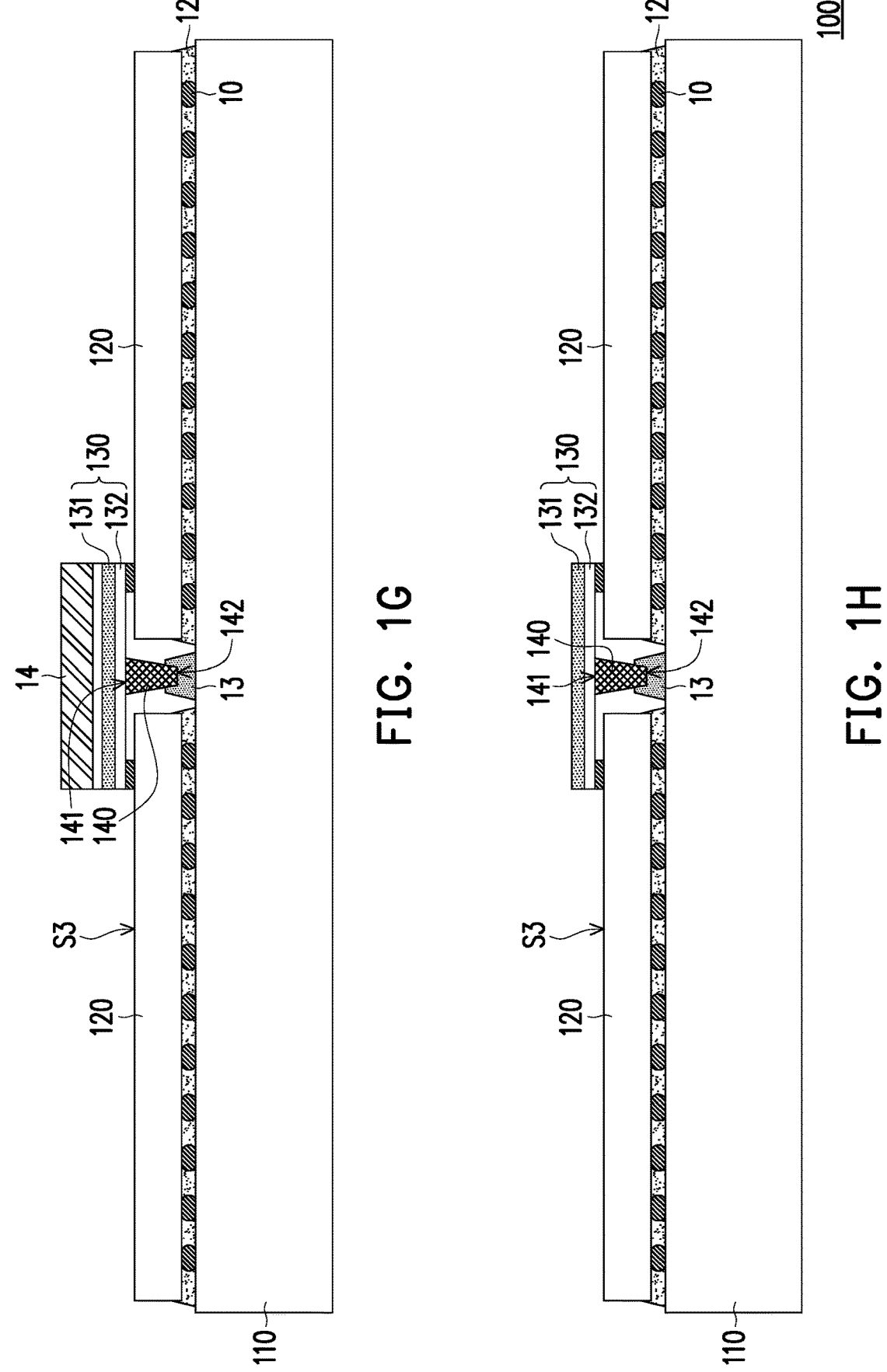

Next, as shown in FIG. 1G, the structure shown in FIG. 1F is flipped to be combined with the structure shown in FIG. 1C. In the embodiment, the supporting structure 140 is located between the two adjacent circuit structure layers 120, and the left and right sides of the supporting structure 140 are separated from the circuit structure layer 120, that is, do not contact the circuit structure layer 120, but the disclosure is not limited thereto.

Further, the supporting structure 140 also has a second end 142 opposite to the first end 141. The second end 142 is connected to the colloid 13 of the circuit board 110. For example, the second end 142 is inserted into the colloid 13, so that the colloid 13 is located between the second end 142 and the circuit board 110. The first end 141 of the supporting structure 140 is higher than a surface S3 of the circuit structure layer 120. The bridge structure 130 is connected between the two adjacent circuit structure layers 120. The metal circuit layer 132 is electrically connected between the two adjacent circuit structure layers 120 as a high-speed bus. Such a configuration can achieve faster transmission between the circuit structure layers 120.

Next, as shown in FIG. 1H, the substrate 14 is removed to complete the sheet-like package structure 100.

Figures 1I, 1J:
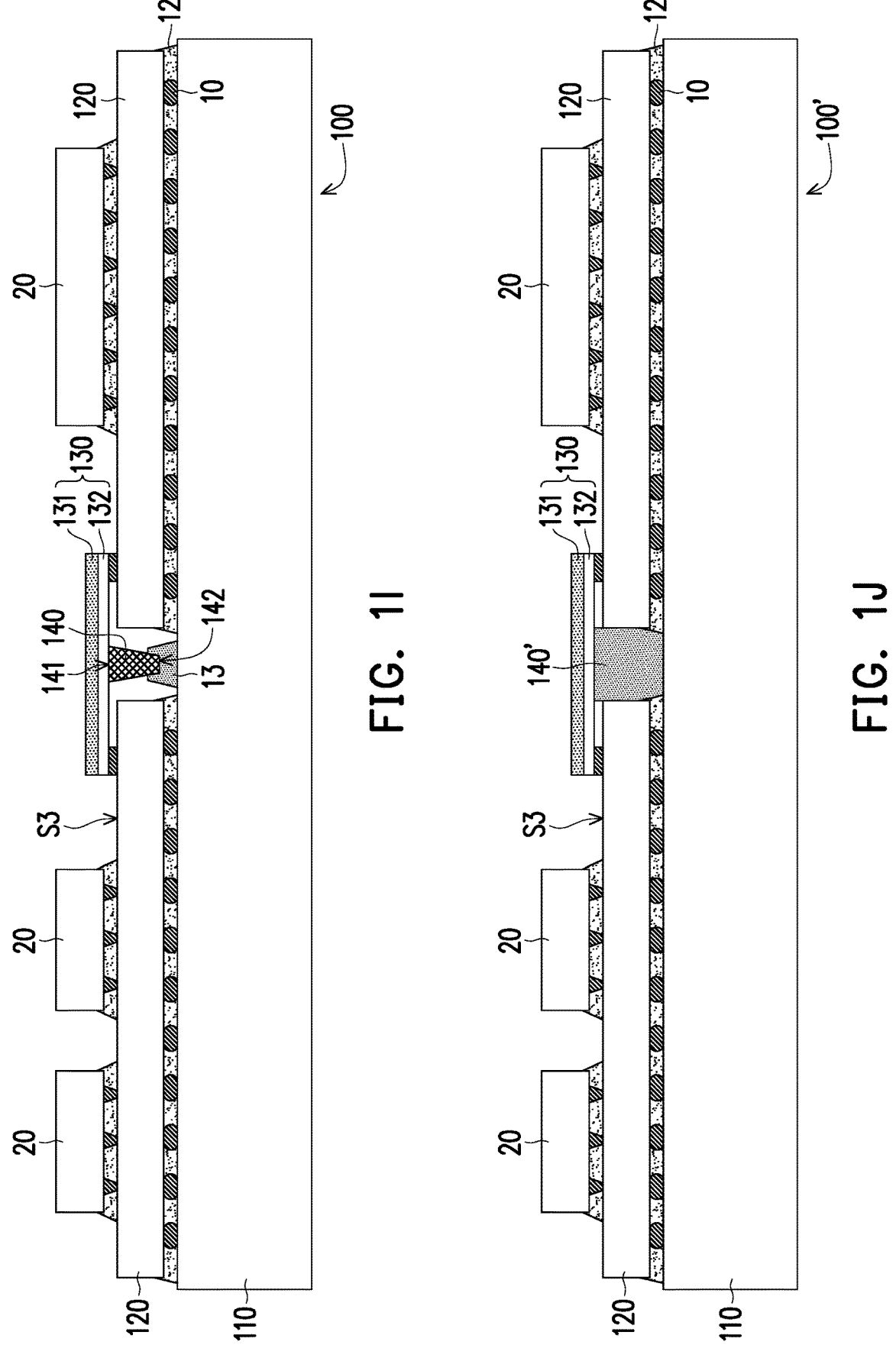
FIG. 1J is a schematic cross-sectional view of some manufacturing process steps of a package structure according to an embodiment of the disclosure.

In addition, as shown in FIG. 1I, the package structure 100 of the embodiment is, for example, a carrier board for packaging. Multiple chips 20 may be disposed on the circuit structure layers 120 of the package structure 100 to have higher performance. The number and the size of the chips 20 respectively corresponding to the circuit structure layer 120 may be determined according to the requirements of the process, but the disclosure is not limited thereto. In the embodiment, the line/pitch (L/S) of the circuit structure layer 120 is 1/1, the bump pitch under the chip 20 is approximately greater than or equal to 60 μmm, and the bump diameter under the chip is approximately equal to 30 μmm, but the disclosure is not limited thereto.

In the embodiment, the supporting structure 140 is manufactured by lithography and is erected on the colloid 13, but in other embodiments, the supporting structure may also be directly formed by dispensing in the step of FIG. 1C. FIG. 1J is a schematic cross-sectional view of some manufacturing process steps of a package structure according to another embodiment of the disclosure. For example, please refer to FIG. 1J. A colloid of a package structure 100' is, for example, filled between the two adjacent circuit structure layers 120 as a supporting structure 140', then the supporting structure 140' may be in contact with the circuit structure layers 120. Next, the bridge structure 130 is covered on the supporting structure 140' and is lapped between the two adjacent circuit structure layers 120, but the disclosure is not limited thereto.

Under the above configuration, the package structure 100 is a board-level heterogeneous integration, and the circuit structure layers 120 may be spliced with each other according to the requirements of the process to have an expandable and highly flexible design. In addition, according to experiments, the package structure 100 including the bridge structure 130 and the supporting structure 140 can effectively reduce the overall warpage value. In other words, the package structure 100 of the embodiment can simultaneously achieve the advantages of large area and not easy to warp.

In another embodiment, even if the bridge structure 130 omits the metal circuit layer 132, the buffer layer 131 may be used as a lap structure to achieve the effect of suppressing warpage, but the disclosure is not limited thereto.

In this way, the structure of the package structure 100 of the embodiment is not easily delaminated, the circuit of the circuit structure layer 120 is not easily broken, and the contact 10 is not easily damaged, so that a thinner circuit layer design can be achieved, and the cost and repair issues can also be greatly resolved.

Figure 2:
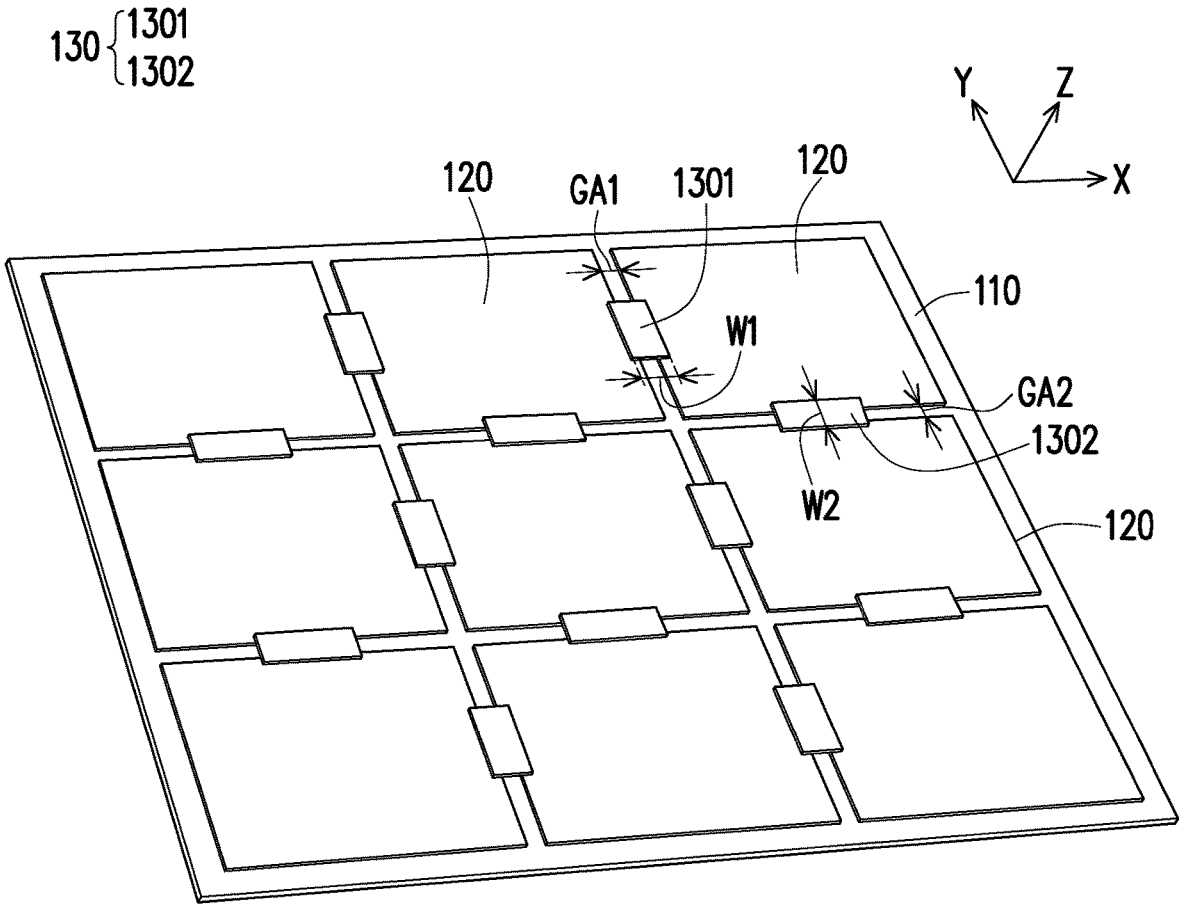
FIG. 2 is a schematic perspective view of a package structure according to an embodiment of the disclosure.

FIG. 2 is a schematic perspective view of a package structure according to an embodiment of the disclosure. Please refer to FIG. 2. In the embodiment, the thinned circuit structure layer 120 may be formed into a three-in-one large-area high-efficiency carrier with higher yield and lower cost by transfer technology, which includes an interposer of a redistribution layer (RDL), an IC substrate, and a PCB. The area of the high-end carrier is expanded to large-area applications and has better performance in repair, yield, and cost to improve competitiveness and advantages.

In the embodiment, the circuit structure layers 120 may be spliced with each other according to the requirements of the process. For example, the bridge structure 130 includes multiple first bridge structures 1301 arranged along a first direction (for example, the Y axis) and multiple second bridge structures 1302 arranged along a second direction (for example, the X axis). The first direction is different from the second direction. Here, the first direction is perpendicular to the second direction, but the disclosure is not limited thereto.

In the second direction, a width W1 of the bridge structure 1301 is greater than a gap GA1 between the two adjacent circuit structure layers 120. In the first direction, a width W2 of the bridge structure 1302 is greater than a gap GA2 between the two adjacent circuit structure layers 120, but the disclosure is not limited thereto. In other embodiments, the position and the size of the bridge structure may be determined according to the requirements of the actual process, which are not limited in the disclosure.

Other embodiments are listed below for illustration. It must be noted here that the following embodiments continue to use the reference numerals and some content of the foregoing embodiments, wherein the same reference numerals are used to represent the same or similar elements, and the description of the same technical content is omitted. For the description of the omitted part, reference may be made to the foregoing embodiments, which will not be repeated in the following embodiments.

FIG. 3 to FIG. 15 are enlarged schematic cross-sectional views of a package structure according to multiple embodiments of the disclosure. The package structure shown in FIG. 3 to FIG. 15 is schematically simply shown, each element is enlarged for the convenience of description, and the actual number and size ratio thereof are not limited thereto.

Figure 3:
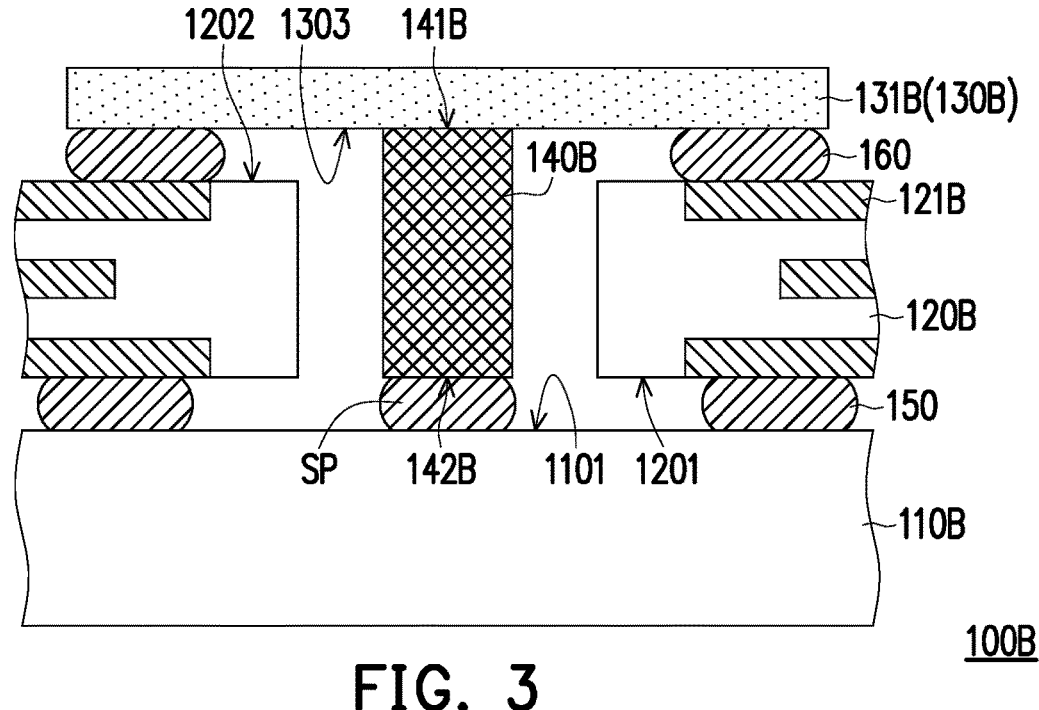
FIG. 3 to FIG. 15 are enlarged schematic cross-sectional views of a package structure according to multiple embodiments of the disclosure.

Please refer to FIG. 3. A package structure 100B includes a circuit board 110B, multiple circuit structure layers 120B, at least one bridge structure 130B, and at least one supporting structure 140B. The circuit structure layer 120B is disposed on a top surface 1101 of the circuit board 110B. The circuit structure layer 120B is, for example, a fine line layer and includes a track 121B. The fine line layer is, for example, a multi-layer structure, and the line width and the line spacing of the fine line layer are smaller than the line width and the line spacing of the circuit board 110B. The bridge structure 130B is connected between the two adjacent circuit structure layers 120B and includes a buffer layer 131B. The supporting structure 140B is located between the two adjacent circuit structure layers 120B, and the supporting structure 140B has a first end 141B and a second end 142B opposite to each other and respectively connecting the bridge structure 130B and the circuit board 110B.

Here, the supporting structure 140B is connected to the circuit board 110B through a solder ball SP. However, in another embodiment, the supporting structure 140B may also be directly connected to the circuit board 110B or connected to the circuit board 110B through a colloid, but the disclosure is not limited thereto. Under the above configuration, the warpage of the circuit structure layer 120B can be effectively suppressed.

Further, the package structure 100B further includes multiple first solder joints 150. The first solder joints 150 are disposed between the first surface 1201 of each circuit structure layer 120B and the top surface 1101 of the circuit board 110B, wherein each circuit structure layer 120B is electrically connected to the circuit board 110B through the first solder joints 150.

The package structure 100 further includes multiple second solder joints 160. The second solder joints 160 are disposed between a bottom surface 1303 of each bridge structure 130 and second surfaces 1202 of the circuit structure layers 120, wherein each bridge structure 130 is electrically connected to the circuit structure layers 120 through the second solder joints 160. Since the buffer layer 131B has elasticity, when the heights of the circuit structure layers 120B on two sides are different, the height difference may be filled to balance the connection of the two sides. Here, the bottom surface 1303 of the bridge structure 130 is, for example, a bottom surface of the buffer layer 131B.

Figure 4:
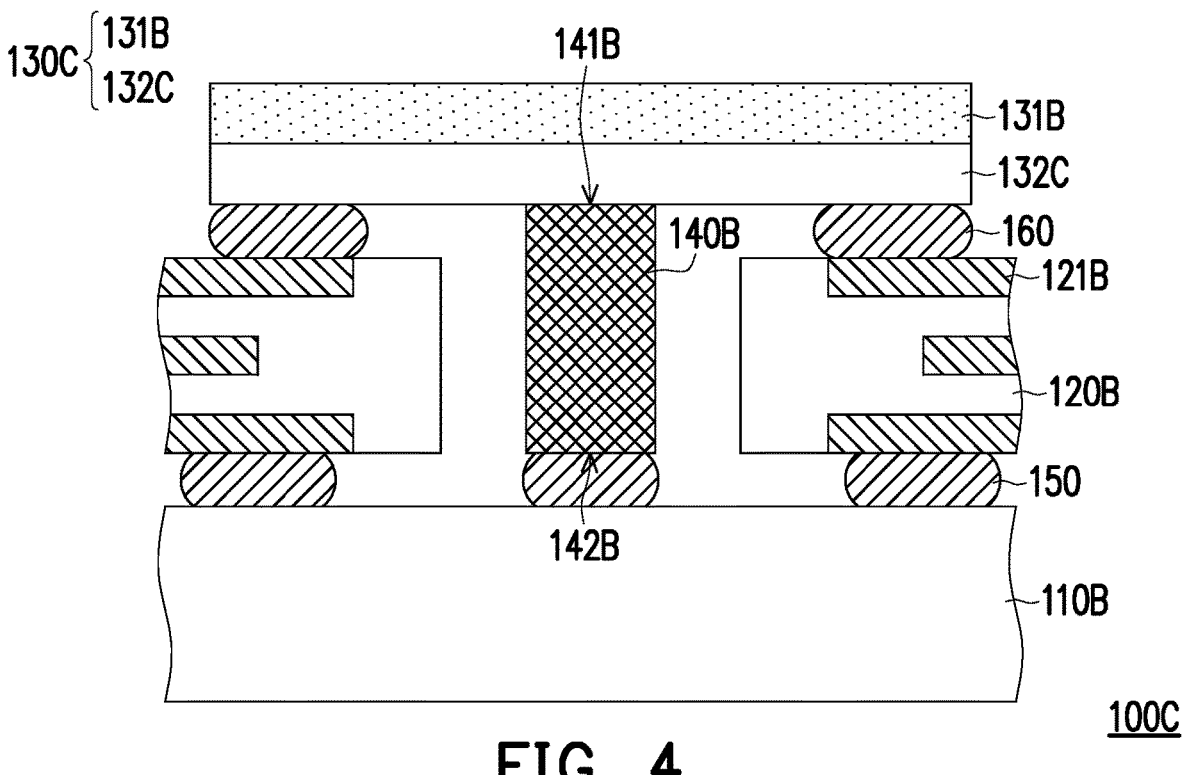

Please refer to FIG. 4. In the embodiment, a package structure 100C is slightly different from the package structure 100B in FIG. 3, and the main difference is that a bridge structure 130C further includes a metal circuit layer 132C. The metal circuit layer 132C is located under the buffer layer 131B, the metal circuit layer 132C is located between the buffer layer 131B and the circuit structure layer 120B, and the metal circuit layer 132C is electrically lapped between the two adjacent circuit structure layers 120B to improve performance.

Figure 5:
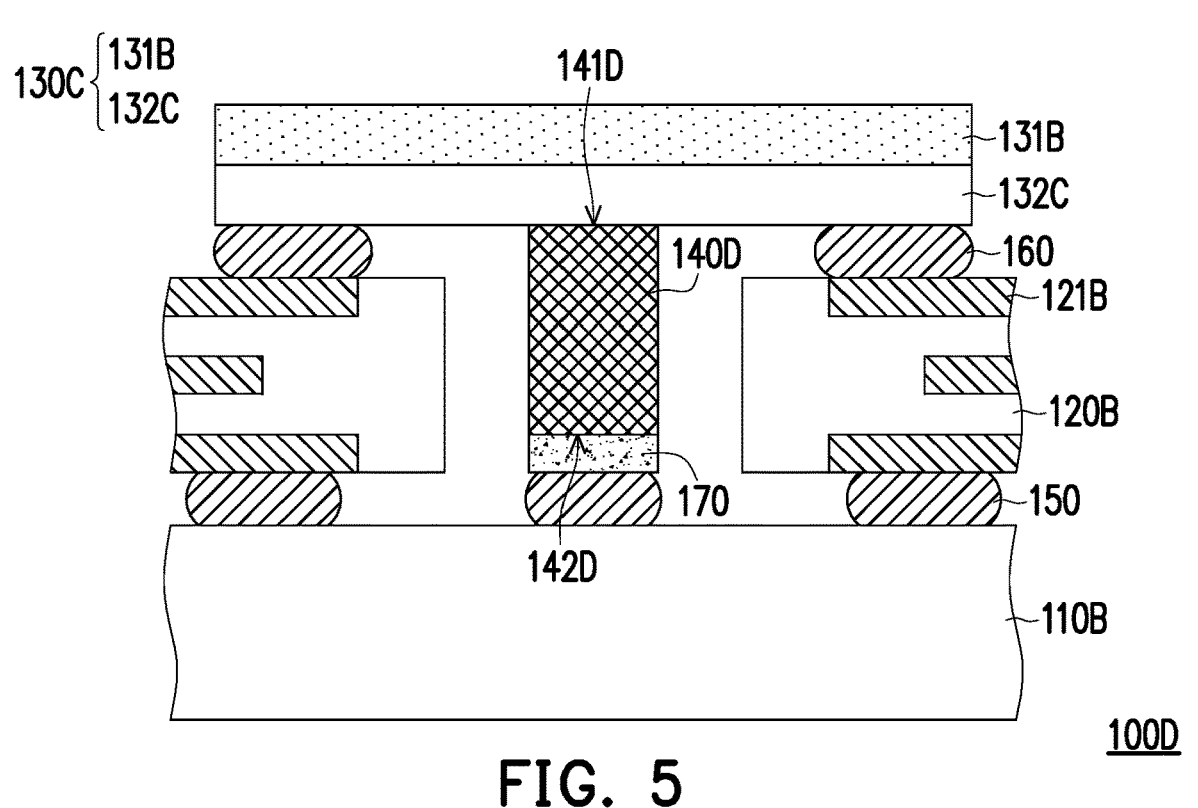

Please refer to FIG. 5. In the embodiment, a package structure 100D is slightly different from the package structure 100C in FIG. 4, and the main difference is that the package structure 100D further includes at least one elastic layer 170, a supporting structure 140D has a first end 141D and a second end 142D opposite to each other, the elastic layer 170 is disposed between the second end 142D of the supporting structure 140D and the circuit board 110B to provide a buffer force during the process, and the elastic layer 170 may be used to fine-tune the height difference of each batch caused by the process error. The material of the elastic layer 170 may include rubber, but the disclosure is not limited thereto.

Figure 6:
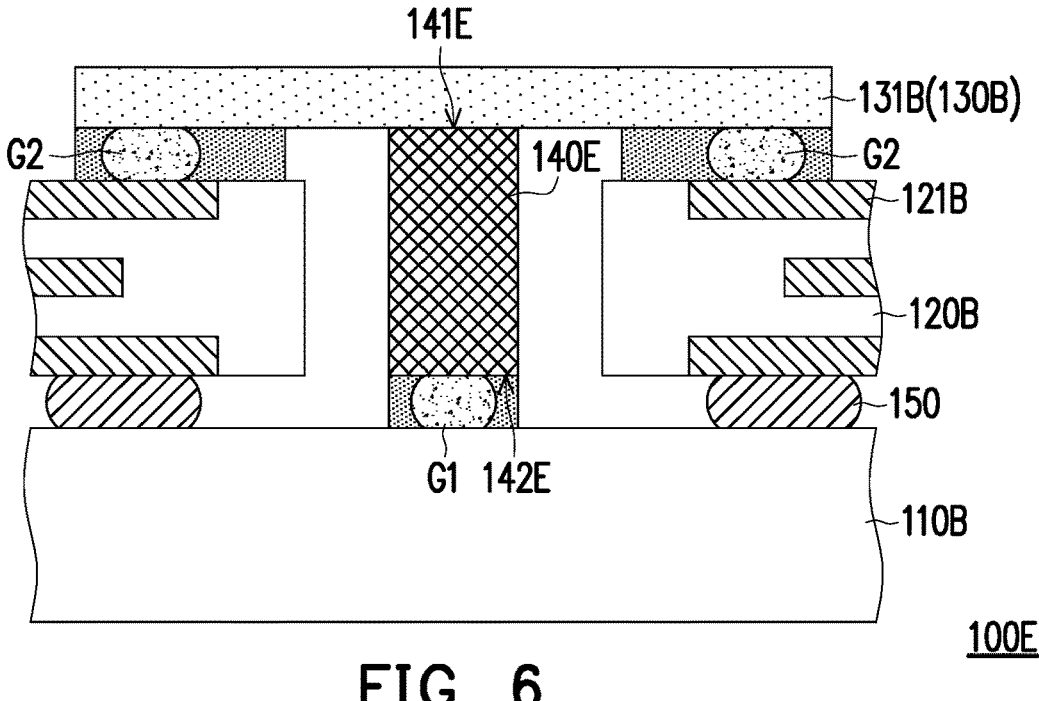

Please refer to FIG. 6. In the embodiment, a package structure 100E is slightly different from the package structure 100B in FIG. 3, and the main difference is that the package structure 100E includes at least one first colloid G1 and multiple second colloid G2. A supporting structure 140E has a first end 141E and a second end 142E opposite to each other. The first colloid G1 is disposed between the second end 142E of the supporting structure 140E and the circuit board 110B, and the second colloids G2 are disposed between each bridge structure 130 and the circuit structure layers 120. The first colloid G1 and the second colloid G2 are used to improve the buffering effect and are, for example, anisotropic conductive adhesives, but the disclosure is not limited thereto.

Figure 7:
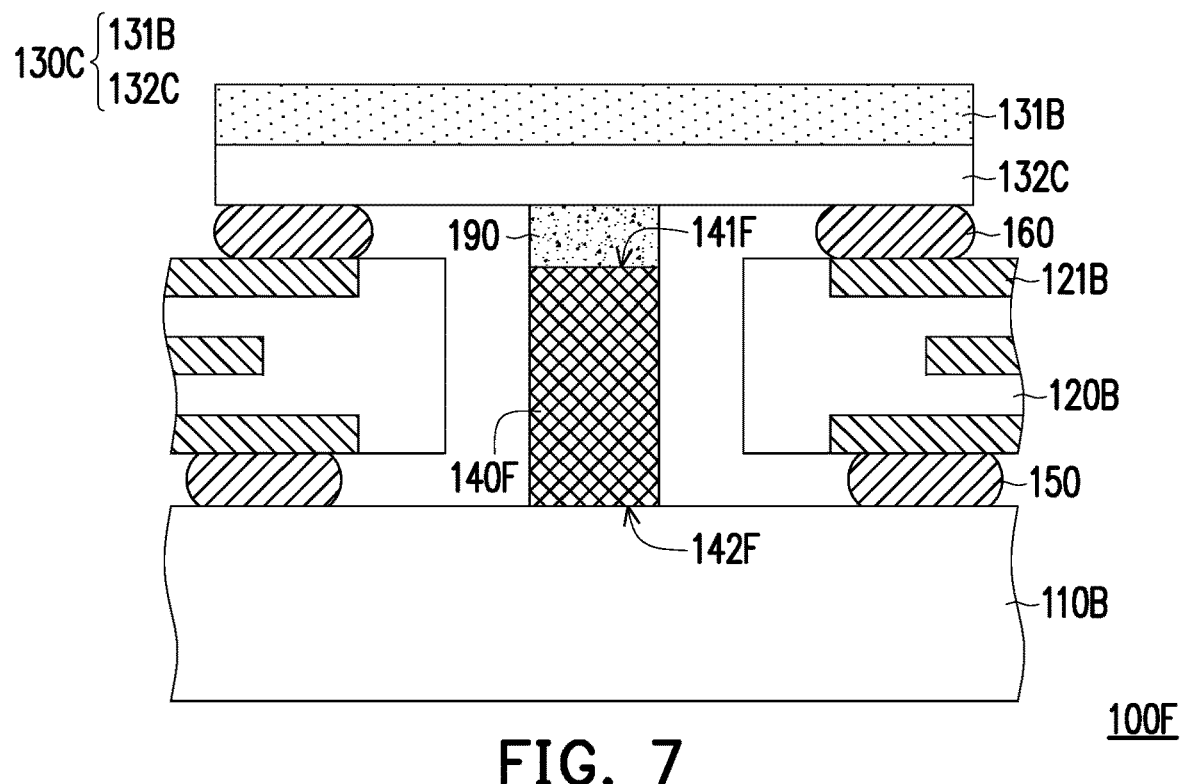

Please refer to FIG. 7. In the embodiment, a package structure 100F is slightly different from the package structure 100C in FIG. 4, and the main difference is that the package structure 100F includes at least one connecting structure 190, the connecting structure 190 is disposed between a first end 141F of a supporting structure 140F and the bridge structure 130, and the connecting structure 190 is a non-conductive material. In another embodiment, the connecting structure 190 may also be disposed between a second end 142F of the supporting structure 140F and the circuit board 110B, but the disclosure is not limited thereto.

Figure 8:
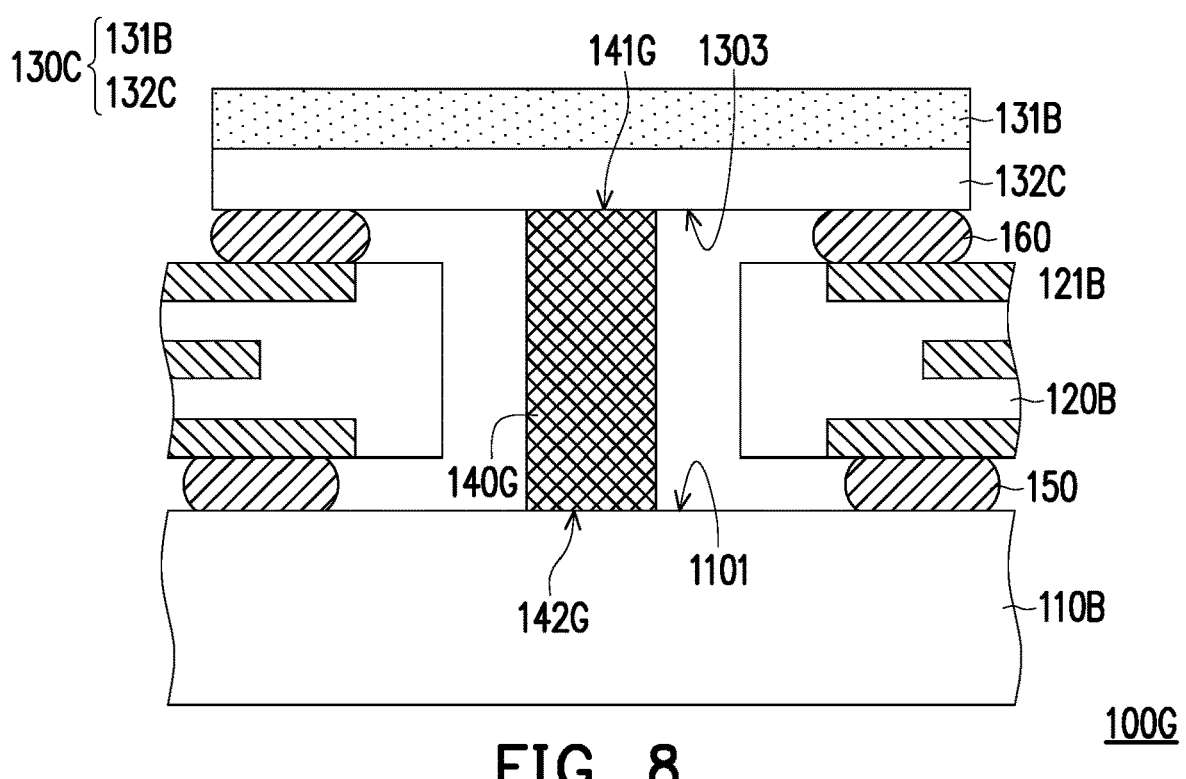

Please refer to FIG. 8. In the embodiment, a package structure 100G is slightly different from the package structure 100C in FIG. 4, and the main difference is that a first end 141G of a supporting structure 140G of the package structure 100G directly contacts the bottom surface 1303 of the bridge structure 130C, and a second end 142G directly contacts the top surface 1101 of the circuit board 110B. Here, the bottom surface 1303 of the bridge structure 130C refers to a bottom surface of the metal circuit layer 132C.

Figure 9:
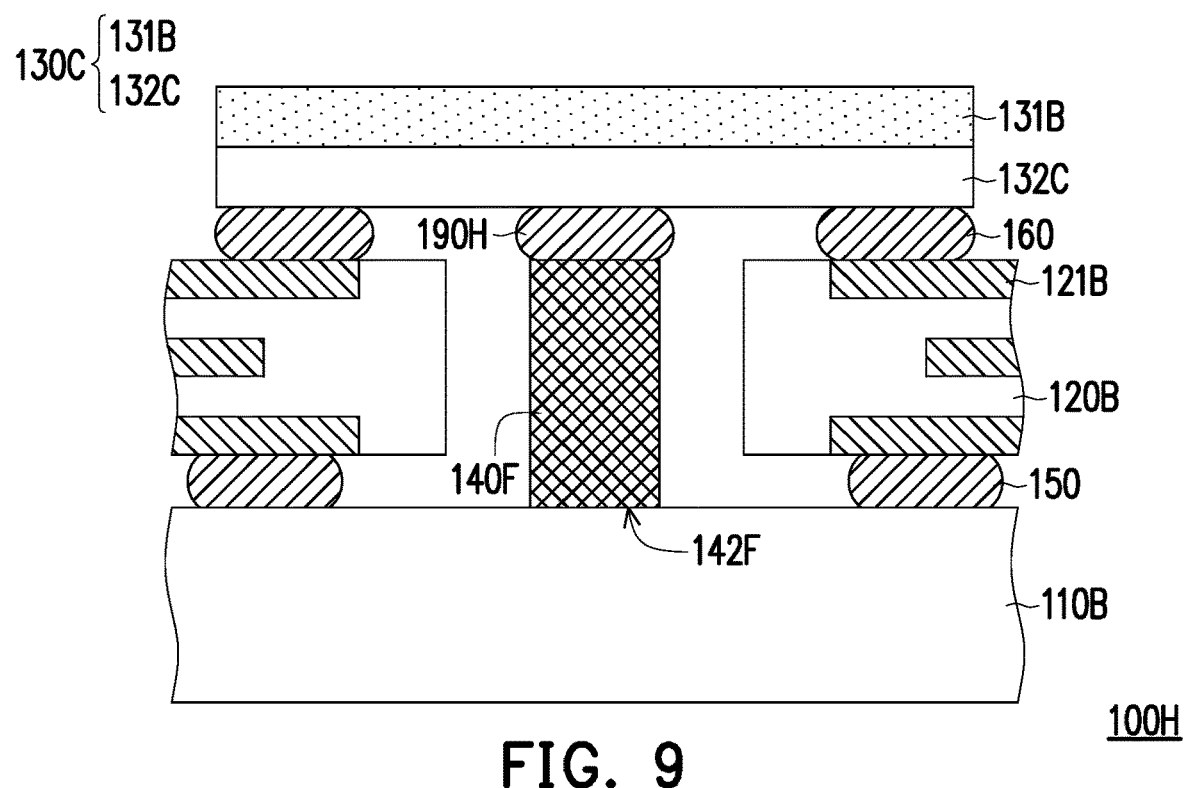

Please refer to FIG. 9. In the embodiment, a package structure 100H is slightly different from the package structure 100F in FIG. 7, and the main difference is that a connecting structure 190H of the package structure 100H is a conductive material, and the connecting structure 190H is, for example, a solder ball, but the disclosure is not limited thereto.

In the foregoing embodiments of FIG. 3 to FIG. 9, the shapes of the supporting structures 140B, 140D, 140E, 140F, and 140G are rectangular columns, that is, the widths of the first ends and the second ends of the supporting structures 140B, 140D, 140E, 140F, and 140G are equal, but the disclosure is not limited thereto.

Other aspects of the supporting structures are described below.

Figure 10:
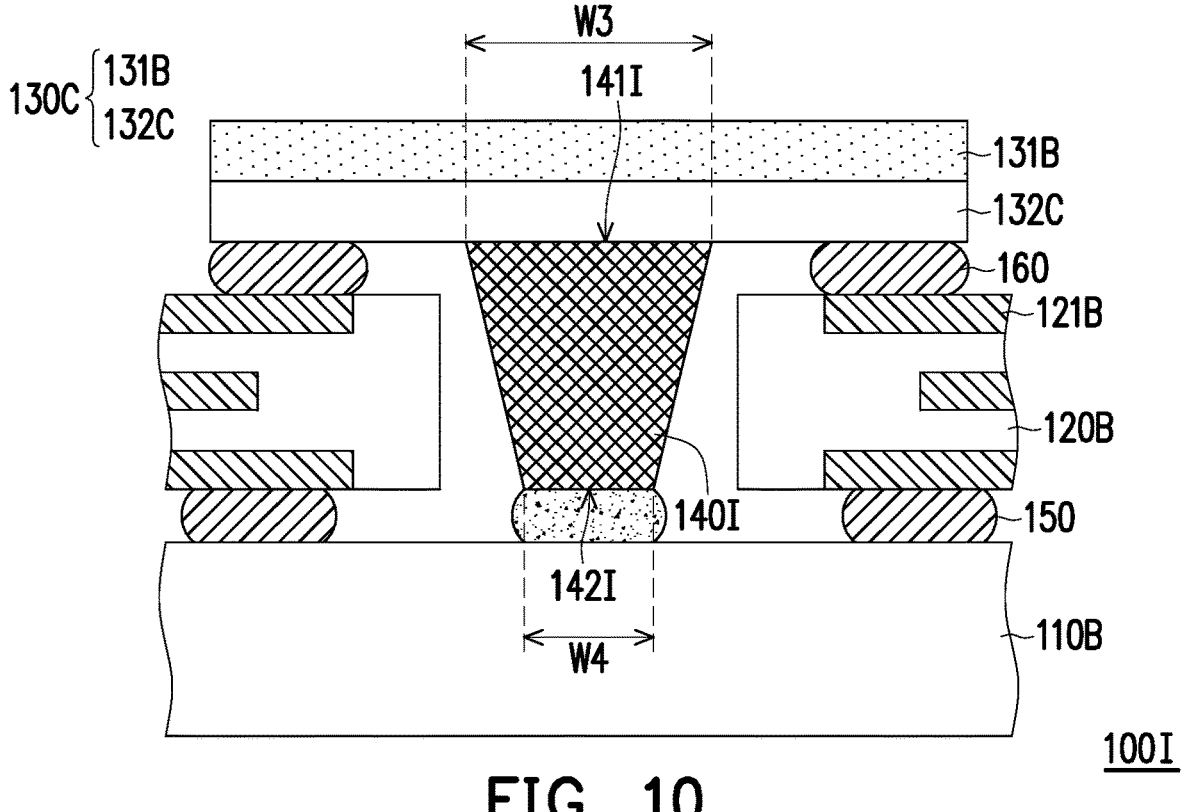

Please refer to FIG. 10. In the embodiment, a package structure 100I is slightly different from the package structure 100C in FIG. 4, and the main difference is that the shape of a supporting structure 140I is an inverted trapezoidal column. Specifically, a first end 141I of the supporting structure 140I has a first width W3, a second end 142I has a second width W4, and the first width W3 is greater than the second width W4.

Figure 11:
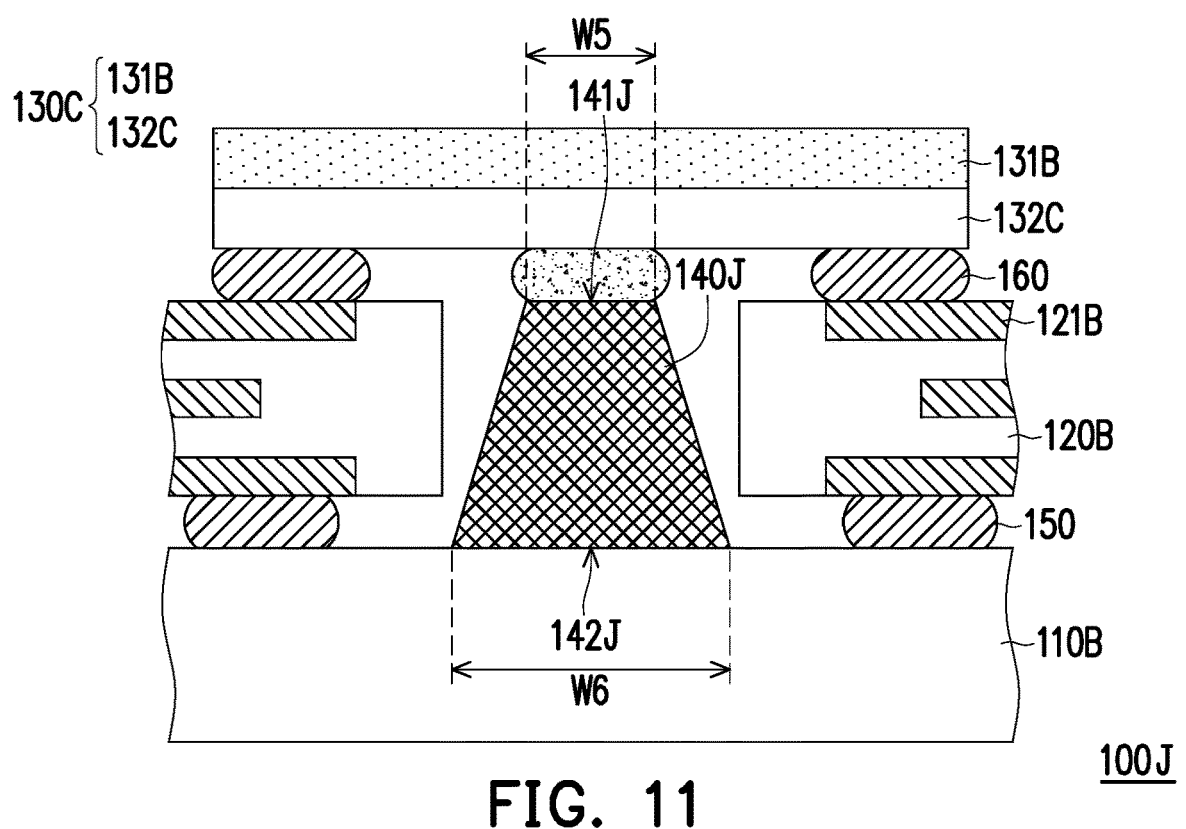

Please refer to FIG. 11. In the embodiment, a package structure 100J is slightly different from the package structure 100I in FIG. 10, and the main difference is that the shape of a supporting structure 140J is a trapezoidal column. Specifically, a first end 141J of the supporting structure 140J has a first width W5, a second end 142J has a second width W6, and the first width W5 is smaller than the second width W6.

Figure 12:
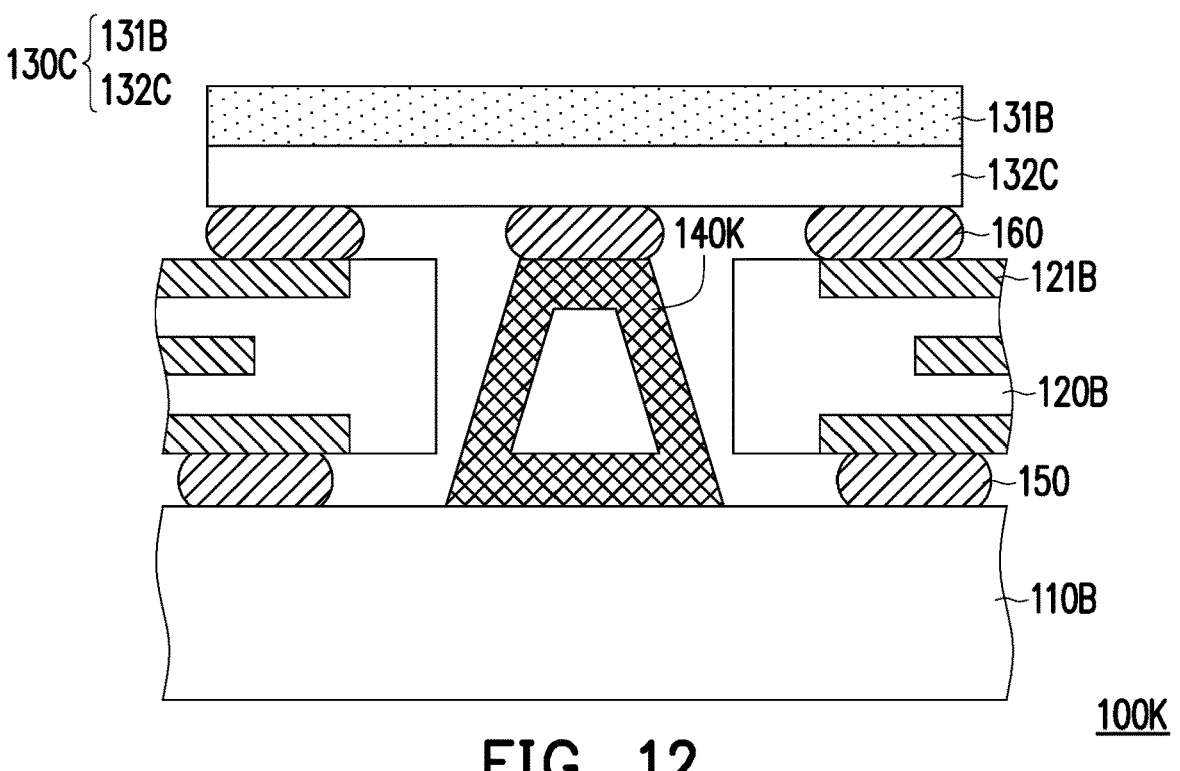

Please refer to FIG. 12. In the embodiment, a supporting structure 140K of a package structure 100K is a hollow structure. The advantage of the design is that the supporting structure 140K can provide better elastic force and deformation force.

Figure 13:
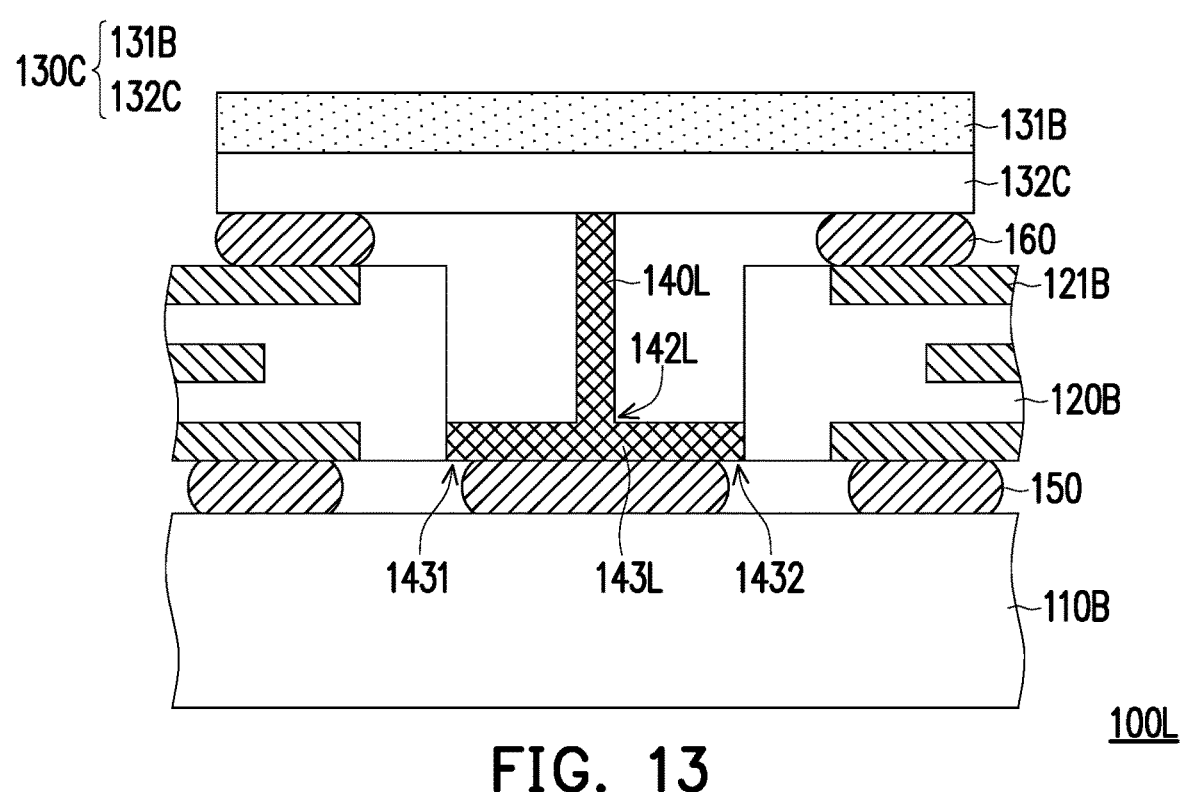

Please refer to FIG. 13. In the embodiment, a supporting structure 140L of a package structure 100L further includes an extension section 143L. The extension section 143L laterally extends from a second end 142L of each supporting structure 140L. The extension section 143L has a third end 1431 and a fourth end 1432 opposite to each other and respectively connected to the two adjacent circuit structure layers 120B. Here, the extension section 143L is parallel to the bridge structure 130B, and the supporting structure 140L has, for example, an inverted T shape, but the disclosure is not limited thereto.

Figure 14:
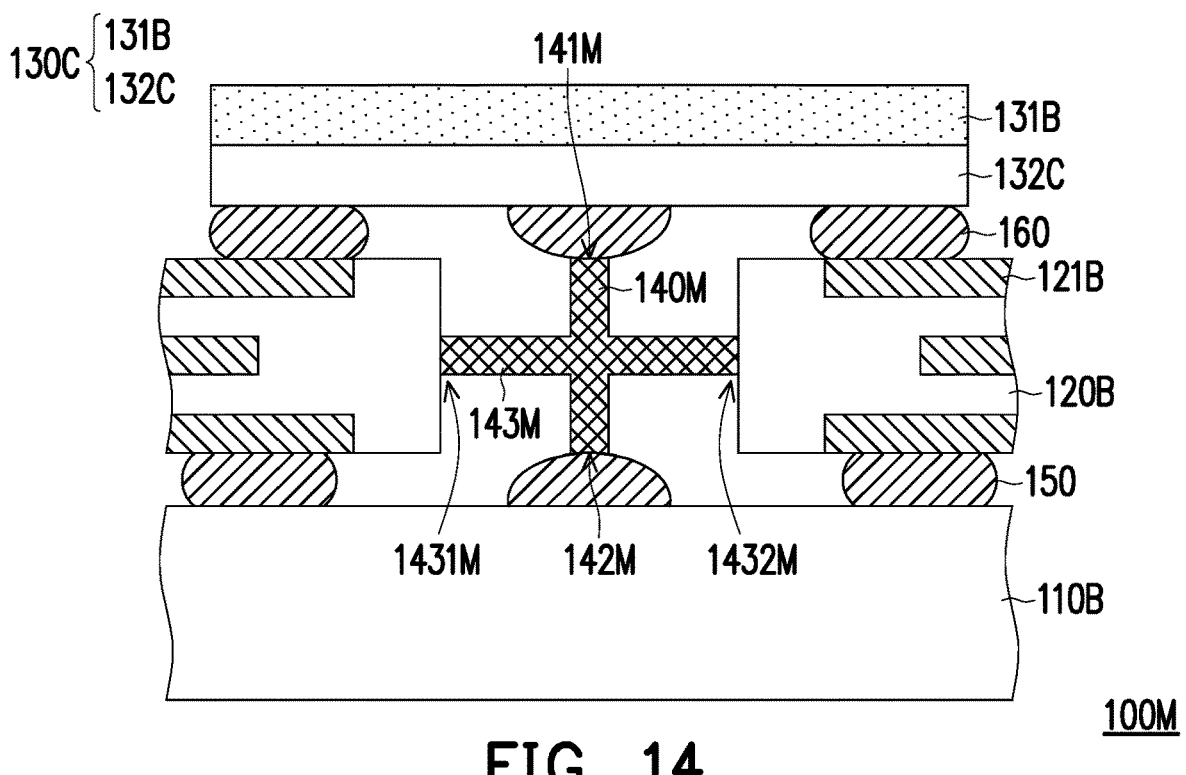

Please refer to FIG. 14. In the embodiment, a supporting structure 140M of a package structure 100M further includes a middle section located between a first end 141M and a second end 142M and an extension section 143M located in the middle section. The extension section 143M laterally extends and has a third end 1431M and a fourth end 1432M opposite to each other and respectively connected to the two adjacent circuit structure layers 120B. Here, the extension section 143M is parallel to the bridge structure 130B, and the supporting structure 140M has, for example, a cross shape, but the disclosure is not limited thereto.

Figure 15:
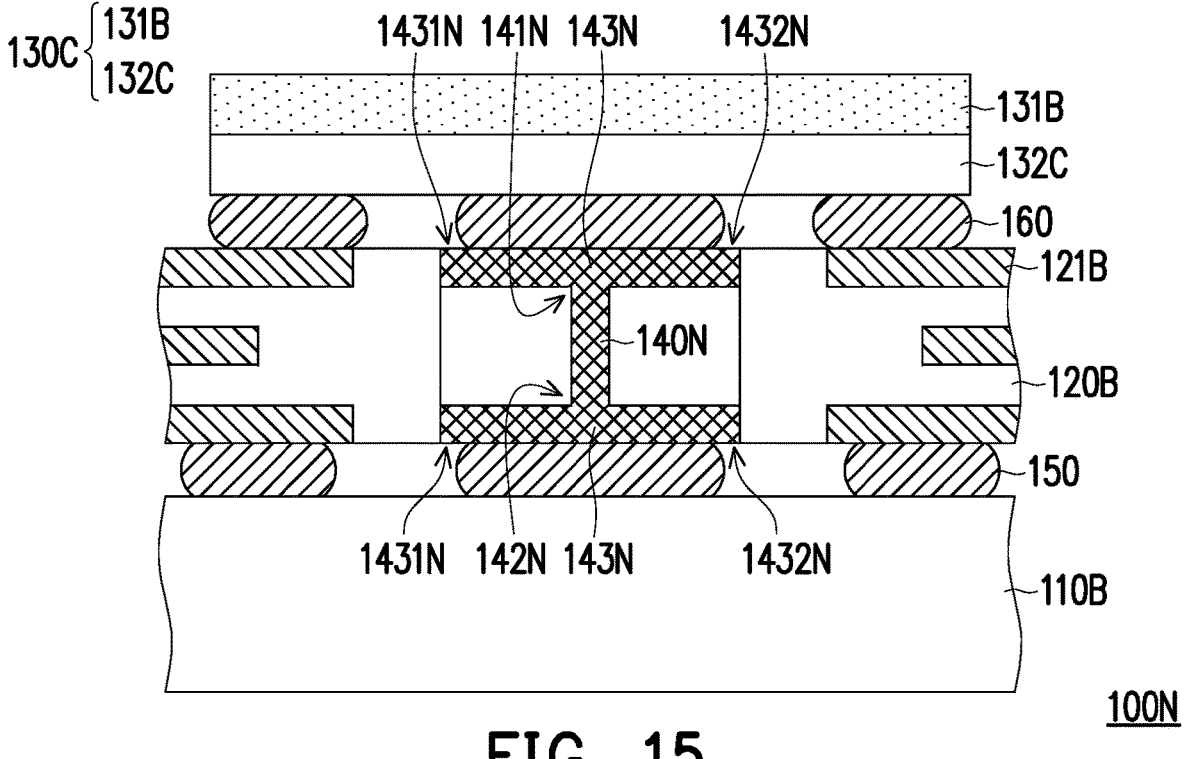

Please refer to FIG. 15. In the embodiment, a supporting structure 140N of a package structure 100N further includes multiple extension sections 143N. The extension sections 143N are respectively located at a first end 141N and a second end 142N, and each extension section 143N has a third end 1431N and a fourth end 1432N opposite to each other and respectively connected to the two adjacent circuit structure layers 120B. Here, the extension section 143N is parallel to the bridge structure 130B, and the supporting structure 140N has, for example, an I shape, but the disclosure is not limited thereto.

In summary, in the package structure of the disclosure, the bridge structure is connected between the two adjacent circuit structure layers, and the supporting structure is located under the bridge structure to support the bridge structure, so that the two opposite ends of the supporting structure respectively connect the bridge structure and the circuit board. In this way, when the temperature of the package structure increases due to the process temperature, the overall warpage deformation of the package structure can be effectively reduced through the design of the bridge structure and the supporting structure. In addition, signals may also be transmitted between the two adjacent circuit structure layers through the bridge structure, and the chips may be disposed on the circuit structure layers to form the high-end carrier, the area of which can be expanded to large-area applications, and the high-end carrier can have better performance in repair, yield, and cost to improve competitiveness and advantages.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A package structure, comprising:
a circuit board;
a plurality of circuit structure layers, disposed on the circuit board;
at least one bridge structure, connected between the two adjacent circuit structure layers of the plurality of the circuit structure layers; and
at least one supporting structure, located between the two adjacent circuit structure layers, and the at least one supporting structure having a first end and a second end opposite to each other and respectively connecting the at least one bridge structure and the circuit board,
wherein each of the at least one bridge structure comprises a buffer layer, and the buffer layer is a non-conductive elastic material with a Young's modulus ranging from 1 GPa to 100 GPa, and the buffer layer balances connection heights between the two adjacent circuit structure layers and the at least one bridge structure, wherein the package structure further comprises:

a plurality of first solder joints, disposed between each of the two adjacent circuit structure layers and the circuit board, wherein each of the two adjacent circuit structure layers is electrically connected to the circuit board through the first solder joints; and a plurality of second solder joints, disposed between each of the at least one bridge structure and the two adjacent circuit structure layers, wherein each of the at least one bridge structure is electrically connected to the two adjacent circuit structure layers through the second solder joints, wherein each of the at least one bridge structure consists only the buffer layer and directly connects the two adjacent circuit structure layers through the second solder joints.

2. The package structure according to claim 1, further comprising:

at least one elastic layer, disposed between the second end of the at least one supporting structure and the circuit board.

3. The package structure according to claim 1, further comprising:

at least one first colloid, disposed between the second end of the at least one supporting structure and the circuit board; and a plurality of second colloids, disposed between each of the at least one bridge structure and the circuit structure layers.

4. The package structure according to claim 1, wherein the first end of the at least one supporting structure is directly connected to the at least one bridge structure, and the second end is directly connected to the circuit board.

5. The package structure according to claim 1, further comprising:

at least one connecting structure, disposed between the first end of the at least one supporting structure and the at least one bridge structure, and the at least one connecting structure is a non-conductive material.

6. The package structure according to claim 1, further comprising:

at least one connecting structure, disposed between the first end of the at least one supporting structure and the at least one bridge structure, and the at least one connecting structure is a conductive material.

7. The package structure according to claim 1, wherein a shape of the at least one supporting structure comprises a trapezoidal column.

8. The package structure according to claim 7, wherein the first end of the at least one supporting structure has a first width, the second end has a second width, and the first width is greater than the second width.

9. The package structure according to claim 7, wherein the first end of the at least one supporting structure has a first width, the second end has a second width, and the first width is smaller than the second width.

10. The package structure according to claim 1, wherein the at least one supporting structure is a hollow structure.

11. The package structure according to claim 1, wherein each of the at least one supporting structure further comprises an extension section located at the second end of each of the at least one supporting structure, and the extension section has a third end and a fourth end opposite to each other and respectively connected to the two adjacent circuit structure layers.

12. The package structure according to claim 1, wherein each of the at least one supporting structure further comprises a middle section located between the first end and the second end and an extension section located in the middle section, and the extension section has a third end and a fourth end opposite to each other and respectively connected to the two adjacent circuit structure layers.

13. The package structure according to claim 1, wherein each of the at least one supporting structure further comprises a plurality of extension sections respectively located at the first end and the second end, and each of the extension sections has a third end and a fourth end opposite to each other and respectively connected to the two adjacent circuit structure layers.

14. The package structure according to claim 1, wherein the two adjacent circuit structure layers are arranged on the circuit board in arrays.

15. The package structure according to claim 1, wherein a Young's modulus of each of the at least one supporting structure is between 1 GPa and 150 GPa.

16. The package structure according to claim 1, wherein a thermal expansion coefficient of each of the at least one supporting structure is between 1 ppm and 50 ppm.

* * * * *